(12) United States Patent
Kim et al.

(10) Patent No.: US 9,935,635 B2
(45) Date of Patent: Apr. 3, 2018

(54) SYSTEMS AND METHODS INVOLVING PSEUDO COMPLEMENTARY OUTPUT BUFFER CIRCUITRY/SCHEMES, POWER NOISE REDUCTION AND/OR OTHER FEATURES

(71) Applicant: GSI Technology, Inc., Sunnyvale, CA (US)

(72) Inventors: Jae-Hyeong Kim, San Ramon, CA (US); Chih Tseng, Fremont, CA (US); Patrick Chuang, Cupertino, CA (US)

(73) Assignee: GSI Technology, Inc., Sunnyvale, CA (US)

( * ) Notice: Subject to any disclaimer, the term of this patent is extended or adjusted under 35 U.S.C. 154(b) by 0 days.

(21) Appl. No.: 15/248,985

(22) Filed: Aug. 26, 2016

(65) Prior Publication Data

US 2017/0063372 A1    Mar. 2, 2017

Related U.S. Application Data

(60) Provisional application No. 62/211,687, filed on Aug. 28, 2015.

(51) Int. Cl.
  *H03K 3/00*        (2006.01)
  *H03K 19/0185*    (2006.01)
(52) U.S. Cl.
  CPC .................. *H03K 19/0185* (2013.01)
(58) Field of Classification Search
  CPC .................................................. H03K 19/0185

USPC .......................................................... 327/109
See application file for complete search history.

(56) References Cited

U.S. PATENT DOCUMENTS

| | | | | |
|---|---|---|---|---|
| 4,649,297 | A * | 3/1987 | Vazehgoo | H03K 5/151 326/19 |
| 5,287,527 | A * | 2/1994 | Delp | G11C 8/12 326/87 |
| 6,237,107 | B1 * | 5/2001 | Williams | G06F 13/4072 713/503 |
| 2003/0151433 | A1 * | 8/2003 | Takai | G11C 7/1066 327/158 |
| 2007/0044055 | A1 * | 2/2007 | Park | G06F 1/04 716/113 |
| 2013/0307590 | A1 * | 11/2013 | Baek | H03K 3/00 327/108 |
| 2014/0354342 | A1 * | 12/2014 | Lou | H03K 19/017509 327/333 |
| 2015/0123826 | A1 * | 5/2015 | Lee | H03M 9/00 341/101 |

* cited by examiner

*Primary Examiner* — Ryan Jager
(74) *Attorney, Agent, or Firm* — DLA Piper LLP US; Nicholas Panno

(57) ABSTRACT

A system may include a first inverter configured to invert a first data signal and a second inverter configured to invert a second data signal. A pull-up element may be coupled to an output of the first inverter on a first terminal and a power source on a second terminal, wherein the power source is also coupled to a pull-up element of a main output buffer. A pull-down element may be coupled to an output of the second inverter on a first terminal and a ground on a second terminal, wherein the ground is also coupled to a pull-down element of the main output buffer.

16 Claims, 2 Drawing Sheets

SYSTEMS AND METHODS INVOLVING PSEUDO COMPLEMENTARY OUTPUT BUFFER CIRCUITRY/SCHEMES, POWER NOISE REDUCTION AND/OR OTHER FEATURES

CROSS-REFERENCE TO RELATED APPLICATION

This application claims priority from U.S. Provisional Application No. 62/211,687, filed Aug. 28, 2016, the entirety of which is incorporated by reference herein.

OVERVIEW

As set forth herein, systems and methods of advanced output buffer circuitry, schemes and/or related features may minimize timing skew among parallel outputs due to SSO (simultaneous switching output) noise.

BACKGROUND

The delay of output buffer in a silicon chip may be strongly affected by power and ground noise. For multiple parallel outputs, depending on data patterns the power and ground noise could be very different. Such differences may cause significant timing skew among outputs. For example, if all but one of the outputs switch at the same direction and the one remaining output switches against all other outputs, different output delay timings for one or more of the outputs may result

DETAILED DESCRIPTION OF ILLUSTRATIVE IMPLEMENTATIONS

A silicon chip with multiple parallel outputs may deliver random output data. In some situations for example, when one of the output data stays high many cycles and changes to low while all other output data switch in the opposite direction (i.e., low to high), large timing skew among the outputs may result Systems and methods described herein may minimize this timing skew by implementing a complementary output buffer in addition to the real output buffer. The complementary output buffer may emulate the real output buffer but may switch in the opposite direction from the real output buffer. Each output buffer may include a small size complementary buffer which may be matched to real output buffer timing. Further, according to certain implementations herein, the pseudo/complementary logic/circuitry/methods may include and/or involve capacitance circuitry (e.g., capacitor, variable capacitor or capacitance, etc.) that includes an emulating capacitance device, element or function which can, or may be utilized to, adjust the amount of capacitance based various considerations related to the features and functionality set forth herein. For example, in one illustrative implementation, the emulating capacitance may be adjustable according to capacitance load value(s).

According to some embodiments, a system may include a first inverter configured to invert a first data signal and a second inverter configured to invert a second data signal. A pull-up element may be coupled to an output of the first inverter on a first terminal and a power source on a second terminal, wherein the power source is also coupled to a pull-up element of a main output buffer. A pull-down element may be coupled to an output of the second inverter on a first terminal and a ground on a second terminal, wherein the ground is also coupled to a pull-down element of the main output buffer.

In some embodiments, third (common) terminals of the main output buffer may drive a load, Cload, representing the capacitive loading of an output signal trace. The third (common) terminals of the complimentary output buffer may drive an equivalent Cemu to match the Cload of the main output buffer.

Figure 1:
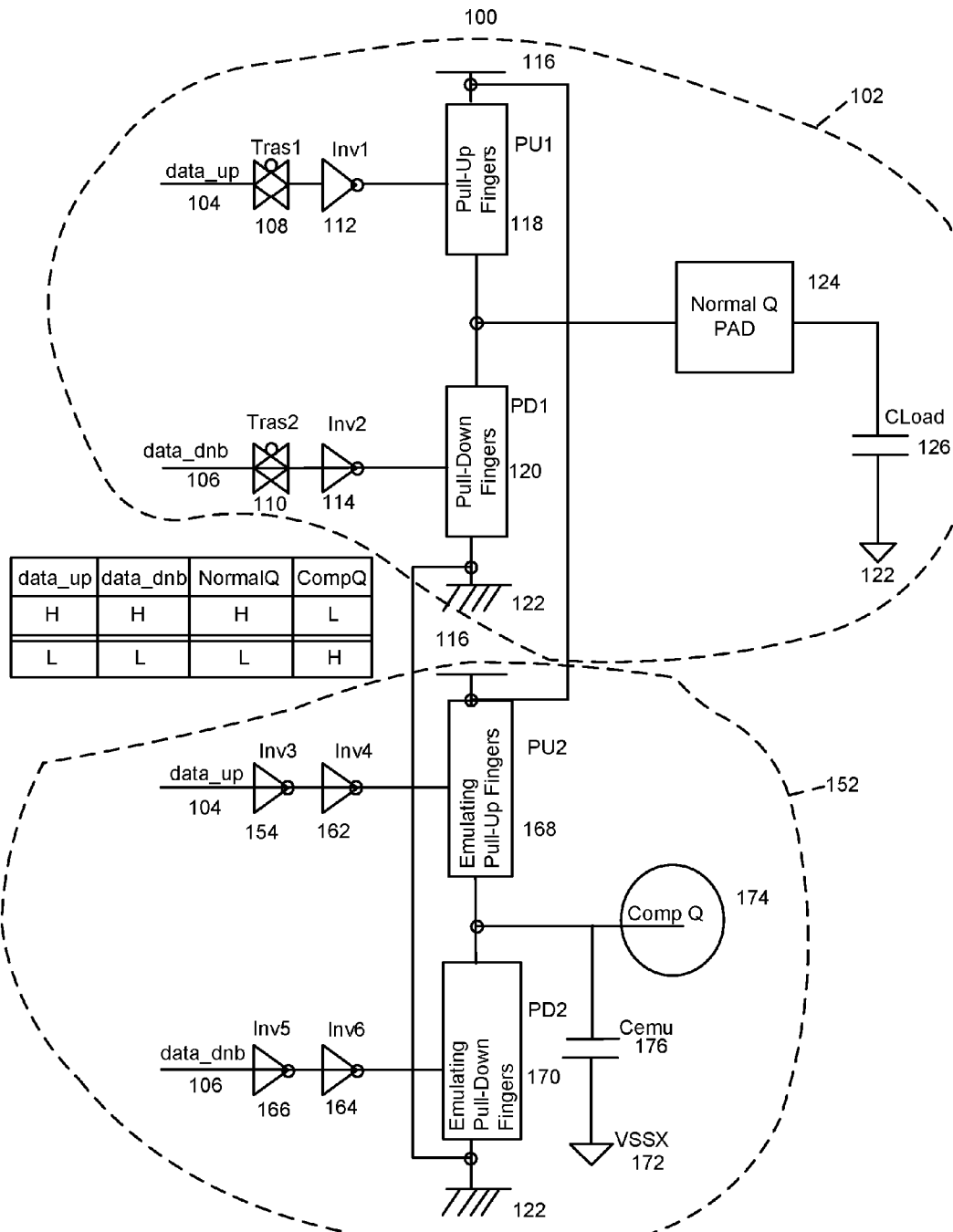
FIG. 1 depicts illustrative output/buffer circuitry consistent with aspects of the innovations herein.

FIG. 1 depicts illustrative output/buffer circuitry 100 consistent with aspects of the innovations herein. The circuitry 100 may include an output buffer circuit 102 and a complementary buffer circuit 152. The complementary output buffer may compensate power noise from the real output buffer. The circuitry 100 may include an internal data_up 104 and an internal data_dnb 106 that may drive pull-up (e.g., PMOS 118) and pull-down (e.g., NMOS 120) of the output buffer 102, respectively. The resulting signal from the output buffer 102 may be supplied to an output pad 124 and thus to a load 126.

The complementary buffer 152 may have data_up 104 and data_dnb 106 inverted (e.g., via inverters 154 and 166) from the data_up 104 and data_dnb 106 of the real output buffer 102, respectively. The complementary buffer 152 may include its own pull-up (e.g., PMOS 168) and pull-down (e.g., NMOS 170) which may be driven by inverted signals 154 and 166, respectively. The resulting signal from the complimentary buffer 152 may be sent to a complementary output 174, but may not actually be supplied to any load. The complementary buffer 152 may have an internal capacitance 176 matching the real output buffer load 126 capacitance. In some embodiments, internal capacitance 176 may be variable so that it can be adjusted to match load 126 capacitance. The output buffer 102 and the complementary buffer 152 may be driven by a power source 116 and connected to a ground 122. Additionally, internal capacitance 176 may be connected to a separate ground 172.

In some example high speed memory circuits, changing several outputs in one direction and several outputs in the opposite direction may result in a standard delay (e.g., approximately 1.5 ns). However, if all but one of the outputs switch at the same direction and the one remaining output switches against all other outputs, the delay may rise due to noise (e.g., to approximately 2.0 ns). However, because the complementary buffer circuit's data switches in the opposite direction from the real buffer circuit's data, the noise from the complementary buffer circuit 152 and the noise from the output buffer circuit 102 may cancel one another out. By coupling the pull-ups 118, 168 to one another at the power source 116 and coupling the pull-downs 120, 170 to one another at the ground 122, the noise signals associated with the complementary switching of the output buffer circuit 102 and the complementary buffer circuit 152 may be averaged for the output buffer output 124, and thus the delay associated with the noise may be reduced. For example, delays may be reduced to approximately 1.5 ns in this case. These delays are presented as examples only, and the circuitry 100 may be used to improve delay skew of any magnitude.

Overall in some systems and methods herein, pull-up 2 may share the same power with pull-up 1, and/or pull-down 2 may share the same ground with pull-down 1. Further, according to some implementations, pull-up 2 and pull-down 2 may have the same impedance value(s) with pull-up 1 and pull-down 1. Additionally, according to embodiments herein, the ground of the emulating capacitance may be separate from the grounds of pull-down 1 and/or pull-down 2. In certain implementations, pull-up 2 and pull-up 1 may be configured to have opposite input voltage(s). Finally, according to some embodiments, pull-down 2 and pull-down 1 may have opposite input voltage(s).

Figure 2:
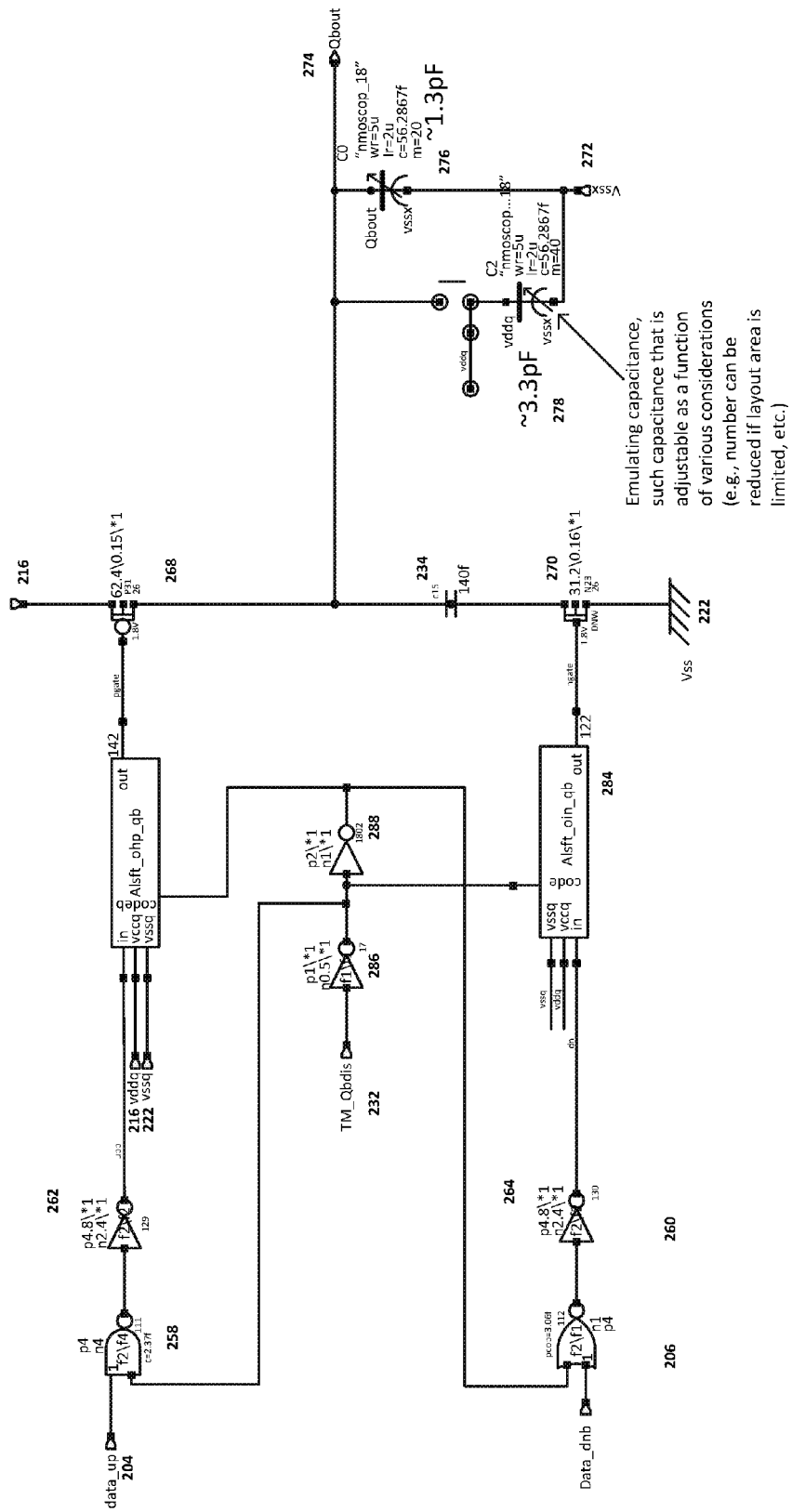
FIG. 2 depicts illustrative complementary output/buffer circuitry consistent with aspects of the innovations herein.

FIG. 2 depicts illustrative complementary output/buffer circuitry 200 consistent with aspects of the innovations herein. The complementary buffer 200 may have data_up 204 and data_dnb 206 inverted (e.g., via inverters 262 and 264) from the data_up and data_dnb of the real output buffer, respectively. The complementary buffer 200 may include its own pull-up (e.g., PMOS 268) and pull-down (e.g., NMOS 270) which may be driven by inverted signals 262 and 264, respectively. The resulting signal from the complementary buffer 200 may be sent to a complementary output 274, but may not actually be supplied to any load. The complementary buffer 200 may have an internal capacitance 276. The complementary buffer 200 may be driven by a power source 216 and connected to a ground 222. Additionally, internal capacitance 276 may be connected to a separate ground 272. The complementary buffer circuit 200 of FIG. 2 may be combined with an output buffer circuit to provide the above-described power noise reduction to reduce switching delay. The capacitance 276 may be set and/or adjusted to match the capacitance of the output buffer load.

The following illustrative example shows various exemplary/representative output timing variation in a 40 nm process chip with 40 ohm output impedance and 5 pF load:
1. 18 Qs case (Q(1)=Read 1,Q(0)=Read 0)
  ⇨ Conventional buffer(Normal Q)
    tfast-tslow(One Q(1) and 17 Q(0))=149 ps
    tfast-tslow (All Q90)=47.8 ps
    Timing skew=101.2 ps
According to the innovations herein:
  ⇨ Conventional buffer(Comp Q)
    tfast-tslow(One Q(1) and 17 Q(0))=68.5 ps
    tfast-tslow (all Q(0))=39 ps
    Timing skew=29.5 ps
    Improvement ~71%

Aspects of the innovations herein may include and/or involve, though are not limited to, features such as the following:

[a]. A system/complementary output/buffer circuitry comprising:
  a first inverter configured to invert a first data signal;
  a second inverter configured to invert a second data signal;
  a pull-up element coupled to an output of the first inverter on a first terminal and a power source on a second terminal, wherein the power source is also coupled to a pull-up element of a main output buffer; and
  a pull-down element coupled to an output of the second inverter on a first terminal and a ground on a second terminal, wherein the ground is also coupled to a pull-down element of the main output buffer.
[b]. The complementary output/buffer circuitry of [a] or any paragraph herein, wherein:
  the pull-up element has a same impedance value as the pull-up element of the main output buffer; and
  the pull-down element has a same impedance value as the pull-down element of the main output buffer.
[c]. The complementary output/buffer circuitry of [a] or any paragraph herein, wherein:
  the pull-up element comprises a PMOS transistor; and
  the pull-down element comprises an NMOS transistor.
[d]. The complementary output/buffer circuitry of [a] or any paragraph herein, further comprising a capacitor coupled to a third terminal of the pull-up element and a third terminal of the pull-down element on a first terminal and a ground separate from the ground coupled to the pull-down element on a second terminal.
[e]. The complementary output/buffer circuitry of [d] or any paragraph herein, wherein a capacitance of the capacitor is adjustable.
[f]. The complementary output/buffer circuitry of [d] or any paragraph herein, wherein a capacitance of the capacitor is set to match a capacitance of a load coupled to the main output buffer.
[g]. The complementary output/buffer circuitry of [a] or any paragraph herein, wherein the non-inverted first data signal is supplied to the pull-up element of the main output buffer.
[h]. The complementary output/buffer circuitry of [a] or any paragraph herein, wherein the non-inverted second data signal is supplied to the pull-down element of the main output buffer.
[i]. Output/buffer circuitry comprising the complementary output buffer of [a] or any paragraph herein.
[j]. Memory circuitry comprising the complementary output buffer of [a] or any paragraph herein.
[k]. Output/buffer circuitry comprising:
a main output buffer comprising:
  a pull-up element configured to receive a first data signal on a first terminal and a power source on a second terminal;
  a pull-down element configured to receive a second data signal on a first terminal and a ground on a second terminal; and
  an output coupled to a third terminal of the pull-up element and a third terminal of the pull-down element and configured to be coupled to a load; and
a complementary output buffer comprising:
  a first inverter configured to invert the first data signal;
  a second inverter configured to invert the second data signal;
  a pull-up element coupled to an output of the first inverter on a first terminal and the power source on a second terminal; and
  a pull-down element coupled to an output of the second inverter on a first terminal and the ground on a second terminal.
[l]. The output\buffer circuitry of [k] or any paragraph herein, wherein:
  the pull-up element of the complementary output buffer has a same impedance value as the pull-up element of the main output buffer; and
  the pull-down element of the complementary output buffer has a same impedance value as the pull-down element of the main output buffer.
[m]. The output/buffer circuitry of [k] or any paragraph herein, wherein:
  the pull-up element of the complementary output buffer comprises a PMOS transistor; and
  the pull-down element of the complementary output buffer comprises an NMOS transistor.
[n]. The output/buffer circuitry of [k] or any paragraph herein, wherein:

the pull-up element of the main output buffer comprises a PMOS transistor; and the pull-down element of the main output buffer comprises an NMOS transistor.

[o]. The output/buffer circuitry of [k] or any paragraph herein, further comprising a capacitor coupled to a third terminal of the pull-up element of the complementary output buffer and a third terminal of the pull-down element of the complementary output buffer on a first terminal and a ground separate from the ground coupled to the pull-down element on a second terminal.

[p]. The output/buffer circuitry of [o] or any paragraph herein, wherein a capacitance of the capacitor is adjustable.

[q]. The output/buffer circuitry of [o] or any paragraph herein, wherein a capacitance of the capacitor is set to match a capacitance of the load coupled to the main output buffer.

[r]. Memory circuitry comprising the output/buffer circuitry of [k] or any paragraph herein.

[s]. Methods of memory and/or output circuitry operation as set forth herein.

[t]. Methods of fabricating memory and/or output/buffer circuitry set forth herein.

While various embodiments have been described above, it should be understood that they have been presented by way of example and not limitation. It will be apparent to persons skilled in the relevant art(s) that various changes in form and detail can be made therein without departing from the spirit and scope. In fact, after reading the above description, it will be apparent to one skilled in the relevant art(s) how to implement alternative embodiments. For example, other steps may be provided, or steps may be eliminated, from the described flows, and other components may be added to, or removed from, the described systems. Accordingly, other implementations are within the scope of the following claims.

In addition, it should be understood that any figures which highlight the functionality and advantages are presented for example purposes only. The disclosed methodology and system are each sufficiently flexible and configurable such that they may be utilized in ways other than that shown.

Although the term "at least one" may often be used in the specification, claims and drawings, the terms "a", "an", "the", "said", etc. also signify "at least one" or "the at least one" in the specification, claims and drawings.

Finally, it is the applicant's intent that only claims that include the express language "means for" or "step for" be interpreted under 35 U.S.C. 112(f). Claims that do not expressly include the phrase "means for" or "step for" are not to be interpreted under 35 U.S.C. 112(f).

What is claimed is:

1. A system/complementary output/buffer circuitry comprising:
   a first inverter configured to invert a first data signal;
   a second inverter configured to invert a second data signal;
   a pull-up element coupled to an output of the first inverter on a first terminal and a power source on a second terminal, wherein the power source is also coupled to a pull-up element of a main output buffer coupled to a first main input receiving the first data signal;
   a pull-down element coupled to an output of the second inverter on a first terminal and a ground on a second terminal, wherein the ground is also coupled to a pull-down element of the main output buffer coupled to a second main input receiving the second data signal; and
   a capacitor coupled to a third terminal of the pull-up element and a third terminal of the pull-down element on a first terminal and a ground separate from the ground coupled to the pull-down element on a second terminal.

2. The complementary output/buffer circuitry of claim 1, wherein:
   the pull-up element has a same impedance value as the pull-up element of the main output buffer; and
   the pull-down element has a same impedance value as the pull-down element of the main output buffer.

3. The complementary output/buffer circuitry of claim 1, wherein:
   the pull-up element comprises a PMOS transistor; and
   the pull-down element comprises an NMOS transistor.

4. The complementary output/buffer circuitry of claim 1, wherein a capacitance of the capacitor is adjustable.

5. The complementary output/buffer circuitry of claim 1, wherein a capacitance of the capacitor is set to match a capacitance of a load coupled to the main output buffer.

6. The complementary output/buffer circuitry of claim 1, wherein the non-inverted first data signal is supplied to the pull-up element of the main output buffer.

7. The complementary output/buffer circuitry of claim 1, wherein the non-inverted second data signal is supplied to the pull-down element of the main output buffer.

8. Output/buffer circuitry comprising the complementary output buffer of claim 1.

9. Memory circuitry comprising the complementary output buffer of claim 1.

10. Output/buffer circuitry comprising:
    a main output buffer comprising:
       a pull-up element configured to receive a first data signal on a first terminal and a power source on a second terminal;
       a pull-down element configured to receive a second data signal on a first terminal and a ground on a second terminal; and
       an output coupled to a third terminal of the pull-up element and a third terminal of the pull-down element and configured to be coupled to a load; and
    a complementary output buffer comprising:
       a first inverter configured to invert the first data signal;
       a second inverter configured to invert the second data signal;
       a pull-up element coupled to an output of the first inverter on a first terminal and the power source on a second terminal;
       a pull-down element coupled to an output of the second inverter on a first terminal and the ground on a second terminal; and
       a capacitor coupled to a third terminal of the pull-up element of the complementary output buffer and a third terminal of the pull-down element of the complementary output buffer on a first terminal and a ground separate from the ground coupled to the pull-down element on a second terminal.

11. The output\buffer circuitry of claim 10, wherein:
    the pull-up element of the complementary output buffer has a same impedance value as the pull-up element of the main output buffer; and
    the pull-down element of the complementary output buffer has a same impedance value as the pull-down element of the main output buffer.

12. The output/buffer circuitry of claim 10, wherein:
the pull-up element of the complementary output buffer comprises a PMOS transistor; and
the pull-down element of the complementary output buffer comprises an NMOS transistor.

13. The output/buffer circuitry of claim 10, wherein:
the pull-up element of the main output buffer comprises a PMOS transistor; and
the pull-down element of the main output buffer comprises an NMOS transistor.

14. The output/buffer circuitry of claim 10, wherein a capacitance of the capacitor is adjustable.

15. The output/buffer circuitry of claim 10, wherein a capacitance of the capacitor is set to match a capacitance of the load coupled to the main output buffer.

16. Memory circuitry comprising the output/buffer circuitry of claim 10.

* * * * *